(12) United States Patent
Afzal et al.

(10) Patent No.: US 12,181,349 B2
(45) Date of Patent: Dec. 31, 2024

(54) COLOR-CHANGING TORQUE SEAL FOR ELECTRICAL CONNECTIONS

(71) Applicant: APPLIED MATERIALS, INC., Santa Clara, CA (US)

(72) Inventors: Imran Afzal, Georgetown, TX (US); Jeffrey C. Hudgens, San Francisco, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 18/143,225

(22) Filed: May 4, 2023

(65) Prior Publication Data

US 2024/0369425 A1 Nov. 7, 2024

(51) Int. Cl.
| | | |
|---|---|---|
| *G01K 13/00* | (2021.01) | |
| *G01K 11/12* | (2021.01) | |
| *G01R 31/68* | (2020.01) | |
| *H01R 4/36* | (2006.01) | |

(52) U.S. Cl.
CPC .............. *G01K 13/00* (2013.01); *G01K 11/12* (2013.01); *G01R 31/68* (2020.01); *H01R 4/36* (2013.01)

(58) Field of Classification Search
CPC ........ G01K 13/00; G01K 11/12; G01R 31/68; H01R 4/36
See application file for complete search history.

(56) References Cited

U.S. PATENT DOCUMENTS

| | | | |
|---|---|---|---|
| 7,458,861 B1 * | 12/2008 | Eke ......................... | H01R 4/64 439/97 |
| 7,628,117 B2 | 12/2009 | Chen | |
| 9,608,360 B1 | 3/2017 | Yang et al. | |
| 9,889,806 B2 * | 2/2018 | Roselli ..................... | B60R 16/03 |
| 2006/0165153 A1 | 7/2006 | Tillman et al. | |
| 2008/0063026 A1 * | 3/2008 | Roche ..................... | G01K 11/12 374/E11.018 |
| 2011/0312214 A1 * | 12/2011 | Addison ............ | H01R 13/6397 439/571 |

(Continued)

FOREIGN PATENT DOCUMENTS

| | | | | |
|---|---|---|---|---|
| CN | 114305044 A | 4/2022 | | |
| WO | WO-2017125665 A1 * | 7/2017 | ............. | H01R 11/12 |

OTHER PUBLICATIONS

IRISS Engineered Reliability, "Thermo Clip Series," https://iriss.com/safe-connect-thermochromic-solution/thermo-clip-series/#specifications, 2 pages.

(Continued)

*Primary Examiner* — Travis S Chambers
(74) *Attorney, Agent, or Firm* — Lowenstein Sandler LLP

(57) ABSTRACT

The disclosure describes devices and systems for a color-changing torque seal. A system includes multiple electrical connections. Each electrical connection of the multiple electrical connections includes a first electrical connector and a second electrical connector that contacts the first electrical connector. Each electrical connection further includes a color-changing torque seal disposed on the first electrical connector and the second electrical connector. The color-changing torque seal is configured to change color responsive to a temperature change of one or more of the first electrical connector or the second electrical connector.

20 Claims, 5 Drawing Sheets

(56) References Cited

U.S. PATENT DOCUMENTS

| | | | |
|---|---|---|---|
| 2013/0322984 A1* | 12/2013 | Bauchot | F16B 19/04 |
| | | | 411/501 |
| 2020/0040394 A1* | 2/2020 | Paul | C12Q 1/6876 |
| 2020/0284665 A1 | 9/2020 | Hudson | |
| 2024/0141944 A1* | 5/2024 | Mall, Jr. | B64C 39/024 |

OTHER PUBLICATIONS

International Search Report and Written Opinion for International Application No. PCT/US2024/010354, mailed Apr. 29, 2024, 08 Pages.

\* cited by examiner

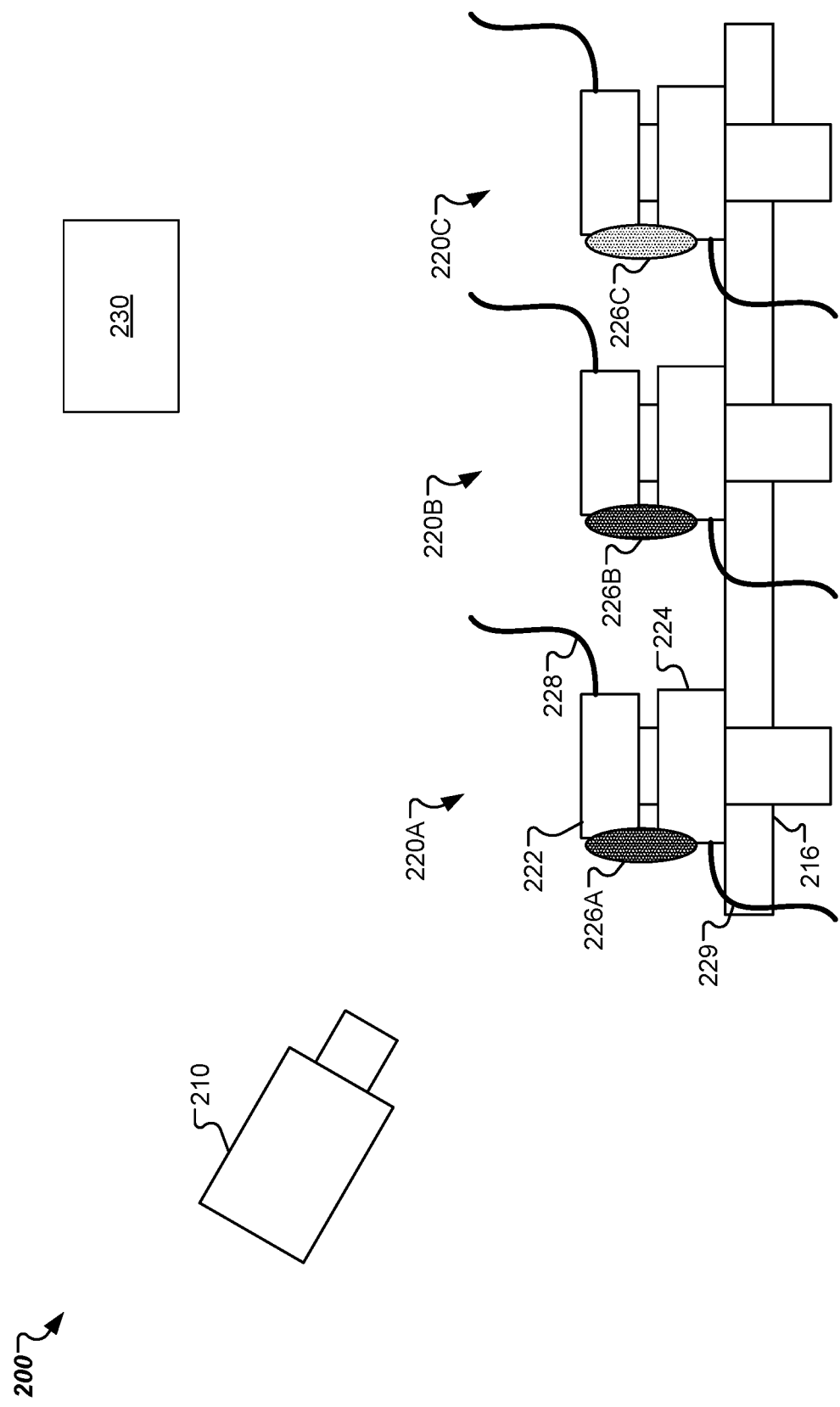

*400A*

```
Capture image data, by one or more cameras, associated with a color-changing
torque seal of an electrical connection
410
```
↓
```
Determine, by a processing device, that a temperature of the electrical connection has
reached a threshold temperature based on processing of the image data associated
with the color-changing torque seal
420
```
↓
```
Determine, by the processing device, a corrective action responsive to a determination
that the electrical connection has reached the threshold temperature
430
```

```
Couple a first electrical connector to a second electrical connector
460
```
↓
```
Torque the first and/or second electrical connector to a predetermined torque value
470
```
↓
```
Apply a color-changing torque seal paste to the first electrical connector and the
second electrical connector
480
```

COLOR-CHANGING TORQUE SEAL FOR ELECTRICAL CONNECTIONS

TECHNICAL FIELD

Embodiments of the present disclosure relate, in general, to torque seals, particularly color-changing-torque seals for electrical connections.

BACKGROUND

Complex electronic systems often include many electrical connections. Such electrical connections can include torqued electrical connections such as screw connections, nut-and-fastener connections, etc. Torqued electrical connections may come loose over time and may fail.

Torque seals have been developed to provide a visual indication of whether a torqued connection (such as a torqued electrical connection) has come loose. After torquing of the connection, a torque seal is applied to the connection. If the connection comes loose (e.g., one of the connectors rotates relative to the other), the torque seal is broken. Although conventional torque seals provide visual indication of a loose torqued connection, conventional torque seals do not provide other failure indications of a torqued electrical connection.

SUMMARY

Some of the embodiments described herein cover a system including a plurality of electrical connections. Each electrical connection of the plurality of electrical connections includes a first electrical connector and a second electrical connector that contacts the first electrical connector. Each electrical connection further includes a color-changing torque seal disposed on the first electrical connector and the second electrical connector. The color-changing torque-seal is configured to change color responsive to a temperature change of one or more of the first electrical connector or the second electrical connector.

Some of the embodiments described herein cover an electrical connection. The electrical connection includes a first electrical connector and a second electrical connector that contacts the first electrical connector. The electrical connection further includes a color-changing torque seal disposed on the first electrical connector and the second electrical connector. The color-changing torque seal is configured to change color responsive to a temperature change in one or more of the first electrical connector or the second electrical connector.

Some of the embodiments described herein cover a method. The method includes capturing image data, by one or more cameras, associated with a color-changing torque seal of an electrical connection of a plurality of electrical connections. The electrical connection includes a first electrical connector and a second electrical connector that contacts the first electrical connector. The electrical connection further includes the color-changing torque seal. The color-changing torque seal is configured to change color responsive to a temperature change of one or more of the first electrical connector or the second electrical connector. The method further includes determining, by a processing device, that a temperature of the electrical connection has reached a threshold temperature based on processing of the image data associated with the color-changing torque seal. The method further includes determining, by the processing device, a corrective action responsive to a determination that the temperature of the electrical connection has reached the threshold temperature.

BRIEF DESCRIPTION OF THE DRAWINGS

The present disclosure is illustrated by way of example, and not by way of limitation, in the figures of the accompanying drawings in which like references indicate similar elements. It should be noted that different references to "an" or "one" embodiment in this disclosure are not necessarily to the same embodiment, and such references mean at least one.

FIG. 2 is a side schematic view of an example system having electrical connections with a color-changing torque seal, in accordance with some embodiments.

FIG. 4A is a flow chart of a method for determining that an electrical connection has overheated, in accordance with some embodiments.

FIG. 4B is a flow chart of a method for applying a color-changing torque seal to an electrical connection, in accordance with some embodiments.

DETAILED DESCRIPTION OF EMBODIMENTS

Figure 1:
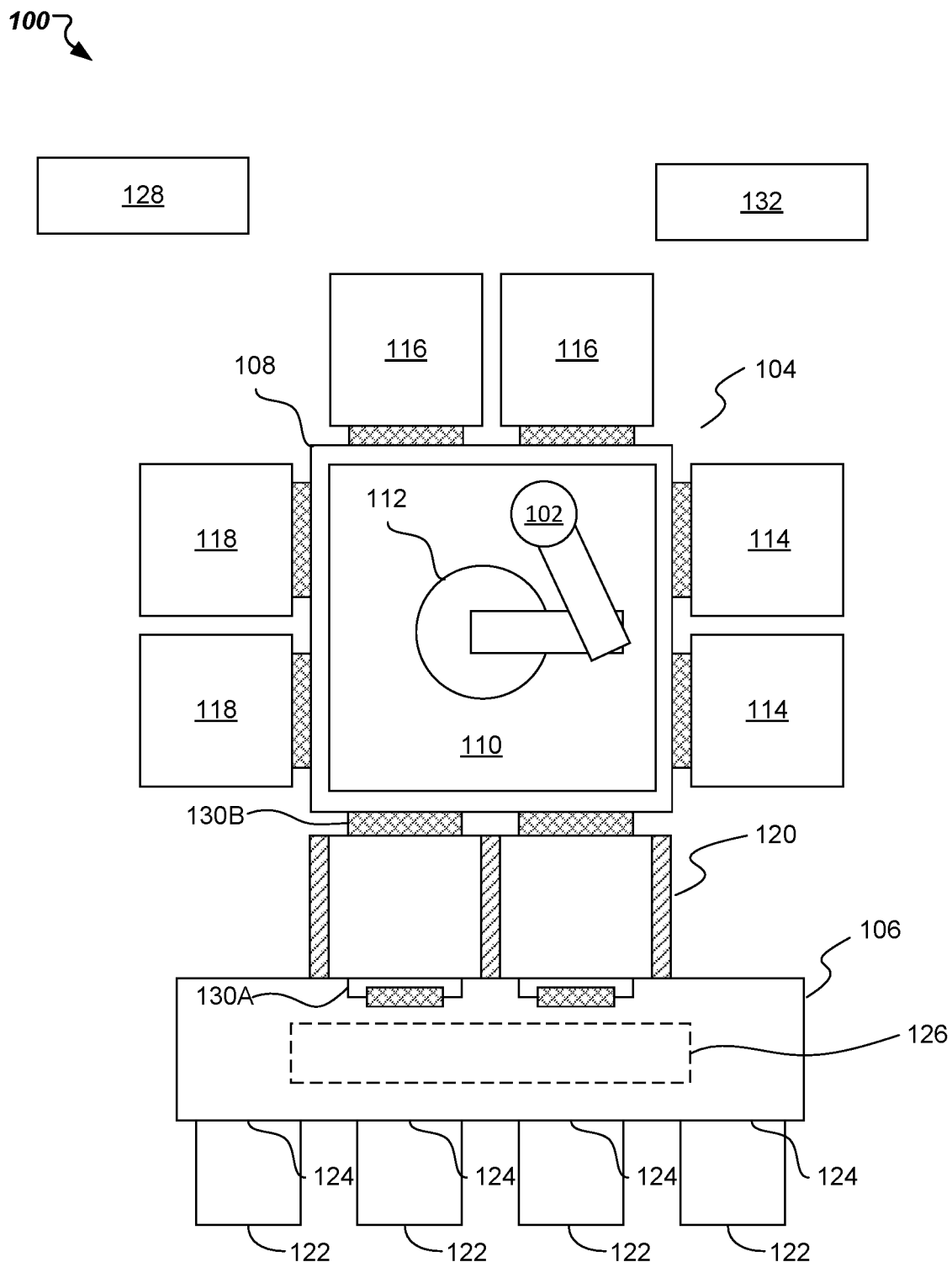
FIG. 1 is a top schematic view of an example electronic device manufacturing system, in accordance with some embodiments.

Embodiments described herein cover systems and methods related to color-changing torque seals for electrical connections. It should be understood that embodiments described herein with regards to color-changing torque seals for electrical connections also apply to torque seals used for any other torqued connection, especially any torqued connection that is affected by heat. In some embodiments, color-changing torque seals can be used on torqued electrical connections of substrate processing systems such as electronic device manufacturing systems. However, color-changing torque seals as described herein can be used on torqued electrical connections of any other system.

Torque seals may be used on torqued connections (e.g., such as nut-and-bolt connections, connections between threaded connectors, etc.) to visually indicate whether the connection has come loose. For example, after a nut is torqued on a bolt, a paste (e.g., torque seal paste) can be applied to both the nut and bolt. The paste cures to form a torque seal on the nut and bolt. If the nut loosens on the bolt (e.g., if the nut rotates relative to the bolt), the torque seal will break, visually indicating that the torqued connection between the nut and bolt has loosened. The loosening of a torqued connection can be caused by tampering and/or vibration. A loosened connection may eventually fail. By including a torque seal on the connection, visual indication of a loosened connection is provided so that the loose connection can be identified before failure of the connection.

Electronic systems often include many electrical connections. At least some of the electrical connections may be torqued connections. For example, an electrical connection may include a ring connector coupled to a threaded stud or screw. During assembly, the threaded stud or screw may be torqued (e.g., by a technician using a tool, etc.) to a predetermined torque specification. The torqued connection between the threaded stud or screw and/or the ring connector may form the torqued electrical connection. A conventional torque seal can be applied to the torqued electrical connection so that the connection can be easily inspected (e.g., by a technician) for looseness.

Sometimes, electrical connections may not be properly torqued. A torque seal can nonetheless be applied to an improperly torqued connection. Thus, a conventional torque seal does not properly indicate that the electrical connection meets the torque specification. An improperly torqued electrical connection may not effectively conduct electrical current from one component to another. The improperly torqued electrical connection can have increased resistance, leading to heating of the connection. Additionally, an improperly designed torqued electrical connection can overheat. Often, an improperly designed electrical connection has at least one connector that is sized too small for an amount of electrical current that is to flow through the connection. If an overheated connection is not identified or too much electrical current is suddenly passed through the connection, the connection may cause a fire that may damage surrounding components.

The color-changing torque seal of the present disclosure overcomes the problems with conventional torque seals by providing a visual indication of temperature. In some embodiments, an electrical connection includes a first electrical connector and a second electrical connector. The first and second electrical connectors may contact one another. In some embodiments, at least one of the first electrical connector or the second electrical connector are threaded connectors. The first and second electrical connectors may be configured to form an electrical connection when torqued to a predetermined value. In some embodiments, a color-changing torque seal is disposed on the first electrical connector and the second electrical connector. The color-changing torque seal may be a torque seal to visually indicate that the torqued connection between the first and second electrical connectors has or has not loosened.

In some embodiments, one or more electrical connectors are coupled via one or more fasteners (e.g., a screw, a nut, a threaded stud, a threaded opening, etc.) to form an electrical connection. The electrical connectors may contact one another responsive to a contact force applied by the one or more fasteners. For example, the torquing of a screw and/or nut may cause two electrical connectors, such as ring connectors, to "sandwich" together. In some embodiments, a color-changing torque seal is disposed on the fasteners and may visually indicate that the electrical connection (e.g., the connection formed by torquing the fastener(s)) has or has not loosened.

In some embodiments, the color-changing torque seal is a thermochromic seal configured to change color when the electrical connection (e.g., made up of the first electrical connector and the second electrical connector) changes temperature. In some embodiments, the color-changing torque-seal changes from a first color to a second color when heated (e.g., by the electrical connection) past a first threshold temperature. The color-changing torque seal may revert back from the second color to the first color when the color-changing torque seal cools past the first threshold temperature in some embodiments. In some embodiments, the color-changing torque seal permanently retains the second color when heated past a higher second threshold temperature. In some examples, the color-changing torque seal permanently changes to the second color after the temperature of the seal exceeds the second threshold temperature and does not revert to the first color when the temperature of the seal cools below the first threshold temperature. In some embodiments, the color-changing torque seal does not change color unless it reaches a threshold temperature, after which it may permanently change color. In some embodiments, the change in color of the color-changing torque seal is indicative of a failure condition of the electrical connection, such as a broken connection, a loose connection, or an under-designed connection. Further, the failure condition can include a poor wire crimp, such as on a wire connector adjacent to the electrical connection. By changing color from the first color to the second color, the color-changing torque seal enables a technician to easily determine that the electrical connection has overheated past a threshold temperature (e.g., past the first and/or second threshold temperature). For example, the technician can determine that the electrical connection has at some point in the past overheated past the second threshold temperature. Moreover, the overheating of the electrical connection can indicate that the electrical connection is in a failure condition as described above.

In some embodiments, inspection and/or monitoring of the electrical connection is automated. In some embodiments, a camera captures image data of the color-changing torque seal. The image data can be processed to determine whether the electrical connection has reached the threshold temperature(s) using the color of the color-changing torque seal as an indicator. Image processing of the images may include performing traditional image processing and/or application of machine learning. For example, different regions of an image generated by a camera may be associated with different electrical connections. A color analysis may be performed on the different regions of the images generated by a camera, and if a region associated with an electrical connection is identified as having a first color that electrical connection may be identified as a potentially failing electrical connection, whereas if the region associated with the electrical connection is identified as having a second color that electrical connection may be identified as a healthy or good condition electrical connection. As described herein, image data indicative of the color-changing torque seal changing from the first color to the second color can be processed to determine that the temperature of the color-changing torque seal has exceed a threshold temperature (e.g., the first threshold temperature described above). Automating the process of monitoring and/or inspecting the electrical connection for overheating can provide continuous temperature data of the electrical connection. In some embodiments, a corrective action can be automatically determined when the color of the color-changing torque seal indicates overheating of the electrical connection. The corrective action may be further inspection (e.g., by a technician), replacement, and/or re-torquing of the electrical connection. In some embodiments, the electrical connections and/or camera may be positioned inside of an electrical box or other hard-to-reach area that might only occasionally be monitored by a technician.

By providing the color-changing torque seal of the present disclosure, several advances can be realized. In some examples, the color-changing torque seal of the present disclosure can provide both a visual indication of whether a torqued electrical connection has loosened and a visual indication of whether the torqued electrical connection has overheated. In some examples, the automated inspection of the electrical connection (e.g., by one or more cameras and/or image data processing) provides continuous monitoring of the torqued electrical connection. The system can thus automatically determine if/when the torqued electrical connection overheats, reducing time for a technician to inspect the connection. Furthermore, the color-changing torque seal of the present disclosure indicates that failure of the electrical connection due to overheating may be imminent, reducing danger from overheating such as fire.

FIG. 1 is a top schematic view of an example electronic device manufacturing system 100, according to aspects of the present disclosure. It is noted that FIG. 1 is used for illustrative purposes, and that different component can be positioned in different location in relation to each view. In some embodiments, system 100 includes multiple torqued electrical connections having a color-changing torque seal.

Electronic device manufacturing system 100 (also referred to as an electronics processing system) is configured to perform one or more processes on a substrate 102. Substrate 102 can be any suitably rigid, fixed-dimension, planar article, such as, e.g., a silicon-containing disc or wafer, a patterned wafer, a glass plate, or the like, suitable for fabricating electronic devices or circuit components thereon.

Electronic device manufacturing system 100 includes a process tool (e.g., a mainframe) 104 and a factory interface 106 (e.g., an EFEM) coupled to process tool 104. Process tool 104 includes a housing 108 having a transfer chamber 110 therein. Transfer chamber 110 includes one or more processing chambers (also referred to as process chambers) 114, 116, 118 disposed therearound and coupled thereto. Processing chambers 114, 116, 118 can be coupled to transfer chamber 110 through respective ports, such as slit valves or the like.

Processing chambers 114, 116, 118 can be adapted to carry out any number of processes on substrates 102. A same or different substrate process can take place in each processing chamber 114, 116, 118. Examples of substrate processes include atomic layer deposition (ALD), physical vapor deposition (PVD), chemical vapor deposition (CVD), etching, annealing, curing, pre-cleaning, metal or metal oxide removal, or the like. In one example, a PVD process is performed in one or both of process chambers 114, an etching process is performed in one or both of process chambers 116, and an annealing process is performed in one or both of process chambers 118. Other processes can be carried out on substrates therein. Processing chambers 114, 116, 118 can each include a substrate support assembly. The substrate support assembly can be configured to hold a substrate in place while a substrate process is performed.

Transfer chamber 110 also includes a transfer chamber robot 112. Transfer chamber robot 112 can include one or multiple arms where each arm includes one or more end effectors at the end of each arm. The end effector can be configured to handle particular objects, such as wafers. Alternatively, or additionally, the end effector is configured to handle objects such as process kit rings. In some embodiments, transfer chamber robot 112 is a selective compliance assembly robot arm (SCARA) robot, such as a 2-link SCARA robot, a 3-link SCARA robot, a 4-link SCARA robot, and so on.

A load lock 120 can also be coupled to housing 108 and transfer chamber 110. Load lock 120 can be configured to interface with, and be coupled to, transfer chamber 110 on one side and factory interface 106 on another side. Load lock 120 can have an environmentally-controlled atmosphere that is changed from a vacuum environment (where substrates are transferred to and from transfer chamber 110) to an at or near atmospheric-pressure inert-gas environment (where substrates are transferred to and from factory interface 106) in some embodiments. In some embodiments, load lock 120 is a stacked load lock having a pair of upper interior chambers and a pair of lower interior chambers that are located at different vertical levels (e.g., one above another). In some embodiments, the pair of upper interior chambers are configured to receive processed substrates from transfer chamber 110 for removal from process tool 104, while the pair of lower interior chambers are configured to receive substrates from factory interface 106 for processing in process tool 104. In some embodiments, load lock 120 is configured to perform a substrate process (e.g., an etch or a pre-clean) on one or more substrates 102 received therein.

Factory interface 106 can be any suitable enclosure, such as, e.g., an Equipment Front End Module (EFEM). Factory interface 106 can be configured to receive substrates 102 from substrate carriers 122 (e.g., Front Opening Unified Pods (FOUPs)) docked at various load ports 124 of factory interface 106. A factory interface robot 126 (shown dotted) can be configured to transfer substrates 102 between substrate carriers (also referred to as containers) 122 and load lock 120. In other and/or similar embodiments, factory interface 106 is configured to receive replacement parts from replacement parts storage containers. Factory interface robot 126 can include one or more robot arms and can be or include a SCARA robot. In some embodiments, factory interface robot 126 has more links and/or more degrees of freedom than transfer chamber robot 112. Factory interface robot 126 can include an end effector on an end of each robot arm. The end effector can be configured to pick up and handle specific objects, such as wafers. Alternatively, or additionally, the end effector can be configured to handle objects such as process kit rings. Any conventional robot type can be used for factory interface robot 126. Transfers can be carried out in any order or direction. Factory interface 106 can be maintained in, e.g., a slightly positive-pressure non-reactive gas environment (using, e.g., nitrogen, other inert gasses, or air with controlled sub-component parameters as the non-reactive gas) in some embodiments.

Factory interface 106 can be configured with any number of load ports 124, which can be located at one or more sides of the factory interface 106 and at the same or different elevations.

Factory interface 106 can include one or more auxiliary components (not shown). The auxiliary components can include substrate storage containers, metrology equipment, servers, air conditioning units, etc. A substrate storage container can store substrates and/or substrate carriers (e.g., FOUPs), for example. Metrology equipment can be used to determine property data of the products that were produced by the electronic device manufacturing system 100. In some embodiments, factory interface 106 can include an upper compartment. The upper compartment can house electronic systems (e.g., servers, air conditioning units, etc.), utility cables, system controller 128, or other components. In some embodiments, the electronic systems, utility cables, etc. housed in the upper compartment include torqued electrical connections having a color-changing torque seal as described herein.

In some embodiments, transfer chamber 110, process chambers 114, 116, and 118, and/or load lock 120 are maintained at a vacuum level. Electronics processing system 100 can include one or more vacuum ports that are coupled to one or more stations of electronic device manufacturing system 100. For example, first vacuum ports 130a can couple factory interface 106 to load locks 120. Second vacuum ports 130b can be coupled to load locks 120 and disposed between load locks 120 and transfer chamber 110.

Electronic device manufacturing system 100 can also include a system controller 128. System controller 128 can be and/or include a computing device such as a personal computer, a server computer, a programmable logic controller (PLC), a microcontroller, and so on. System controller 128 can include one or more processing devices, which can be general-purpose processing devices such as a microprocessor, central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets or processors implementing a combination of instruction sets. The processing device can also be one or more special-purpose processing devices such as an application specific integrated circuit (ASIC), a field programmable gate array (FPGA), a digital signal processor (DSP), network processor, or the like. System controller 128 can include a data storage device (e.g., one or more disk drives and/or solid state drives), a main memory, a static memory, a network interface, and/or other components. System controller 128 can execute instructions to perform any one or more of the methodologies and/or embodiments described herein. The instructions can be stored on a computer readable storage medium, which can include the main memory, static memory, secondary storage and/or processing device (during execution of the instructions). System controller 128 can include an environmental controller configured to control an environment (e.g., pressure, moisture level, vacuum level, etc.) within factory interface 106. System controller 128 can also be configured to permit entry and display of data, operating commands, and the like by a human operator.

In some embodiments, system 100 can further include a power box 132. Power box 132 may house one or more electrical junctions and/or connectors. In some embodiments, power box 132 houses multiple torqued electrical connections having a color-changing torque seal as described herein. In some embodiments, one or more cameras are disposed within power box 132 to capture image data of the multiple torqued electrical connections. Image data captured by the one or more cameras can be used to determine whether any of the torqued electrical connections have overheated.

FIG. 2 is a side schematic view of an example system 200 having electrical connections with a color-changing torque seal, in accordance with some embodiments. In some embodiments, system 200 is disposed within a power box (e.g., power box 132 of FIG. 1). System 200 may include multiple electrical connections and/or junctions for distributing electrical power to multiple components of a larger system (e.g., such as system 100 of FIG. 1). In some embodiments, an electrical connection 220A includes a first connector 222 coupled to electrical lead 228 and a second connector 224 coupled to electrical lead 229. Connector 222 and/or connector 224 may be coupled to a base 216. Base 216 may be electrically-insulating. In some embodiments, one or both of connector 222 and connector 224 are threaded connectors. For example, connector 222 may be a screw and connector 224 may be a nut where connector 222 is configured to couple to connector 224 responsive to an application of torque (e.g., by a screwdriver) to a head of connector 222. In another example, connector 222 and connector 224 may be ring connectors that are coupled by a fastener (e.g., a screw). In some embodiments, a screw couples to a threaded opening in base 216. The screw may apply a force (e.g., a "sandwich" force, etc.) on two or more electrical connectors that contact each other responsive to a torquing of the screw to form an electrical connection.

In some embodiments, a color-changing torque seal 226A is disposed on connector 222 and connector 224. Color-changing torque seal 226A may bridge between connector 222 and connector 224. In some embodiments, a color-changing torque seal 226A is applied on a fastener, a nut, and/or a base having an opening to receive the fastener. The color-changing torque seal 226A may bridge between the fastener, the nut, and/or the base. In some embodiments, color-changing torque seal 226A visually indicates whether connector 224 has rotated relative to connector 222. For example, if connector 224 rotates relative to connector 222, the color-changing torque seal 226A may break. In some embodiments, the color-changing torque seal 226A visually indicates whether a fastener has rotated relative to a nut and/or a base. Rotation of the fastener may indicate that the electrical connection has loosened.

In some embodiments, color-changing torque seal 226A is made of a thermochromic material. Thermochromic material changes color with temperature. In some embodiments, color-changing torque seal 226A has a first color when a temperature of the color-changing torque seal 226A is below a first threshold temperature. When heated above the first threshold temperature, color-changing torque seal 226A may change color from the first color to a second color. In some embodiments, when heated above a higher second threshold temperature, color-changing torque seal 226A permanently retains the second color. In some embodiments, if the color-changing torque seal 226A is heated above the second threshold temperature, the color-changing torque seal 226A will retain the second color as its temperature cools below the second threshold temperature and/or the first threshold temperature. In some embodiments, however, if the color-changing torque seal 226A is heated above the first threshold temperature without exceeding the second threshold temperature, the color-changing torque seal 226A may revert back to the first color responsive to the color-changing torque seal cooling below the first threshold temperature.

In some embodiments, the first threshold temperature is between approximately 40 and 60 degrees Celsius (° C.). In some embodiments, the first threshold temperature is between approximately 45 and 55° C. In some embodiments, the first threshold temperature is approximately 53° C. The second threshold temperature may be higher than the first threshold temperature. In some embodiments, the second threshold temperature is between approximately 60° C. and 80° C. In some embodiments, the second threshold temperature is between approximately 65° C. and 75° C. In some embodiments, the second threshold temperature is approximately 70° C. In some embodiments, the second threshold temperature is a temperature above which the electrical connection may fail and/or poses a fire hazard.

In some embodiments, a paste (e.g., paste-like substance) can be applied by a technician to the connector 222 and connector 224 to form the color-changing torque seal 226A. In some embodiments, the paste is water-based. The paste may cure over time to form the seal. In some embodiments, the past is wet when applied and dries within one hour. The paste may cure within 24 hours. In some embodiments, the paste is squeezed (e.g., by the technician) out of a tube or a syringe and applied onto the connectors 222 and 224. In some embodiments, the color-changing torque seal 226A is made up of a mixture of thermochromic plastic and polypropylene. In some embodiments, the color-changing torque seal 226A is made up of about 5-10% thermochromic plastic and about 90-95% polypropylene.

As shown in FIG. 2, color-changing torque seals 226A and 226B have a first color, indicating that the temperatures of electrical connections 220A and 220B have not exceeded the first threshold temperature. However, color-changing torque seal 226C has a second color, indicating the temperature of electrical connection 220C has exceeded the first threshold temperature.

In some embodiments, system 200 includes one or more cameras to capture image data of the electrical connections 220A-220C. In some embodiments, electrical connections 220A-220C are within a field of view of a camera 210. Particularly, the color-changing torque seals 226A-226C may be within the field of view of the camera 210. In some embodiments, camera 210 collects image data of the electrical connections. In some embodiments, camera 210 is a video camera that collects multiple images per unit of time (e.g., per second). In some embodiments, camera 210 collects only a single image per unit of time. Camera 210 may collect an image only periodically.

In some embodiments, system 200 includes a processor 230. Processor 230 may receive the image data from the camera 210 and perform data processing on the image data. In some embodiments, processor 230 processes the image data to determine the color of each of the color-changing torque seals 226A-226C. Image processing of the images may include performing traditional image processing and/or application of machine learning. For example, different regions of the image data captured by camera 210 may be associated with the different electrical connections 220A-220C. Processor 230 may perform color analysis on the different regions (e.g., of the images). Regions associated with electrical connections 220A and 220B may identify the color-changing torque seals 226A and 226B as having the first color and a region associated with electrical connection 220C may identify the color-changing torque seal 226C as having the second color. The processor 230 may identify electrical connection 220C as having overheated and/or being in a failure state because of identifying the color-changing torque seal 226C as having the second color.

Based on the color of each of the color-changing torque seals 226A-226C, the processor 230 determines whether the first threshold temperature has been exceeded. For example, using image data captured by camera 210, processor 230 can determine that the first threshold temperature has not been exceeded with respect to electrical connections 220A and 220B because color-changing torque seals 226A and 226B have the first color. However, processor 230 can determine that the first threshold temperature has been exceeded with respect to electrical connection 220C because color-changing torque seal 226C has the second color. The color-changing torque seal 226C having the second color may be indicative of electrical connection 220C being broken, loose, or under-designed. Responsive to determining that the first threshold temperature for electrical connection 220C has been exceeded (e.g., because color-changing torque seal 226C has the second color), processor 230 determines and/or initiates a corrective action with respect to electrical connection 220C. In some embodiments, the corrective action is one or more of inspecting the electrical connection 220C, replacing the corresponding first electrical connector and/or second electrical connector, or torquing the electrical connection. In some embodiments, the processor 230 generates an indication of the corrective action (e.g., for display on a GUI). Upon viewing the indication, a technician may perform the corrective action.

In some embodiments, processor 230 can perform data processing on the image data to determine if a color-changing torque seal has broken. A broken color-changing torque seal may be indicative of a loose electrical connection. For example, connector 222 may loosen and rotate relative to connector 224, causing color-changing torque seal 226A to break. Image data captured by camera 210 may indicate the break and processor may identify the break in the image data. In some embodiments, processor 230 determines and/or initiates a corrective action with respect to the broken color-changing torque seal. The corrective action may be inspection, replacement, and/or torquing of the electrical connection. A new color-changing torque seal may be applied after the corrective action is performed.

In some embodiments, processor 230 may utilize one or more machine learning models to process image data, to determine whether an electrical connection has overheated, and/or to determine whether a color-changing torque seal has broken. In some embodiments, image data captured by camera 210 (e.g., one or more images of electrical connections 220A-220C) is input into a trained machine learning model. In some embodiments, the trained machine learning model may be trained with data input including historical image data (e.g., historical images of electrical connections, etc.). The trained machine learning model may be trained with target output data including historical condition data (e.g., historical electrical connection temperature data, historical color-changing torque seal color data, historical electrical connection looseness data, historical color-changing torque seal breakage data, etc.). The trained machine learning model may be trained to output one or more predicted electrical connection conditions based on image data input associated with one or more torqued electrical connections having a color-changing torque seal. In some embodiments, the trained machine learning model is trained to output data indicating whether a torqued electrical connection has a failure condition or whether a failure condition of the torqued electrical connection is likely and/or imminent (e.g., whether the torqued electrical connection has overheated, whether the torqued electrical connection is loose, etc.). Data output from the trained machine learning model may be used to determine a corrective action with respect to a torqued electrical connection.

In some embodiments, where automated inspection of color-changing torque seals (e.g., by camera 210 and/or processor 230) is not possible (e.g., for reasons such as packaging constraints, etc.), a visual inspection may be carried out by a technician to detect any overheating color-changing torque seals and/or any corresponding electrical connections. The technician may be able to determine overheating based on a visual change in color of the color-changing torque seal(s). The visual inspection may be carried out during preventive maintenance of associated equipment and/or on regular time intervals (e.g., such as daily, weekly, monthly, etc.).

Figure 3A:
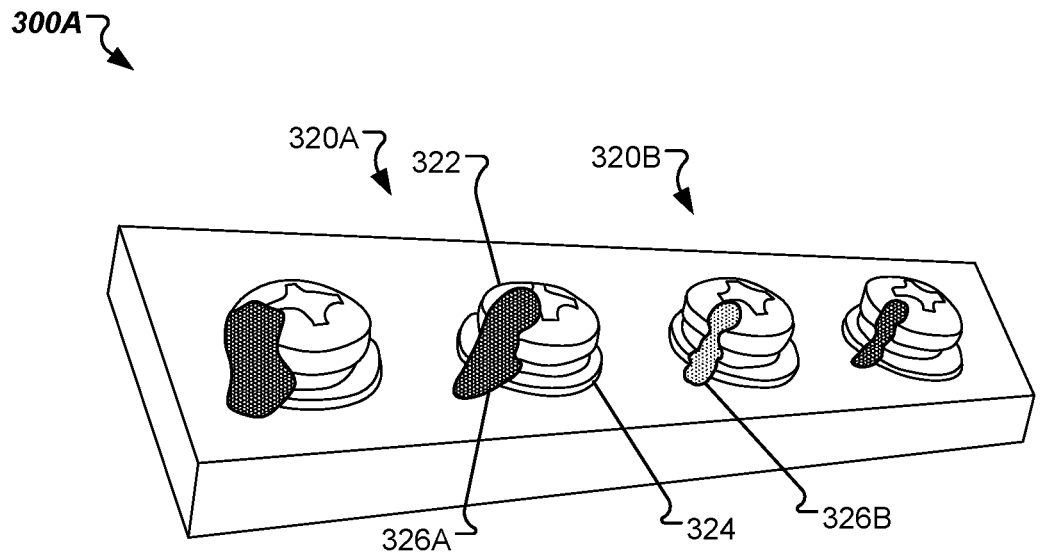
FIGS. 3A-3B are schematic views of example systems having electrical connections with a color-changing torque seal, in accordance with some embodiments.
Figure 3B:
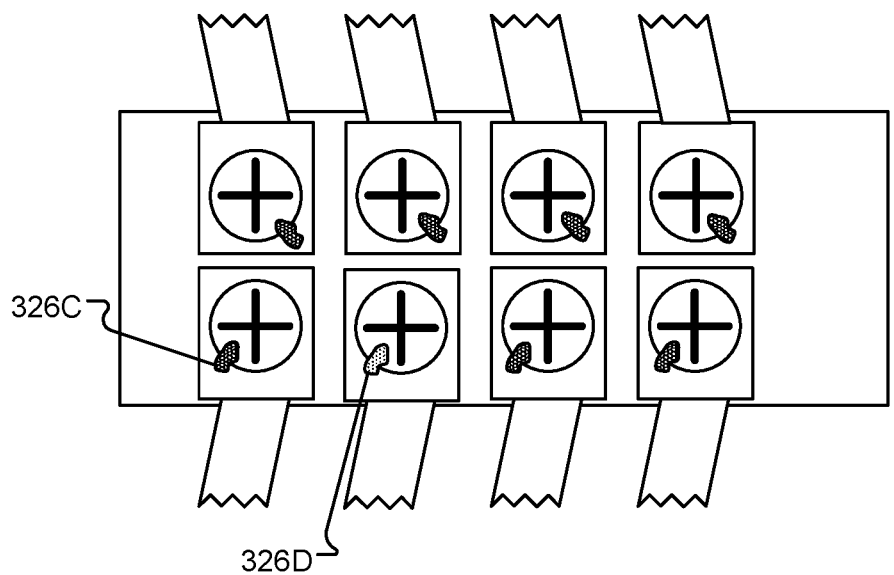

FIGS. 3A-3B are schematic views of example systems having electrical connections with a color-changing torque seal, in accordance with some embodiments. FIG. 3A is a perspective schematic view of an example system 300A including multiple electrical connections with color-changing torque seals, in accordance with some embodiments. FIG. 3B is a top schematic view of an example system 300B including multiple electrical connections with color-changing torque seals, in accordance with some embodiments.

Referring to FIG. 3A, in some embodiments, a screw 322 is coupled to a nut or washer 324. The screw 322 may be coupled (e.g., threaded into) a connecting block. The screw 322 and/or the nut or washer 324 may be part of an electrical connection 320A. For example, the screw 322 may secure one or more electrical connectors (e.g., ring connectors, blade connectors, etc.) that contact each other to form an electrical connection. In some embodiments, the electrical connection is formed responsive to an application of torque to the screw 322 (e.g., via one or more tools such as a screwdriver and/or a wrench, etc.). In some embodiments, a color-changing torque seal 326A is applied on the screw 322 and the nut or washer 324. In some embodiments, the color-changing torque seal 326A may break should the screw 322 loosen (e.g., from the block). In some embodiments, the color-changing torque seal 326A may change color should the screw 322, or the nut or washer 324 increase in temperature and cause the temperature of the color-changing torque seal 326A to exceed a threshold temperature. As a point of comparison, color-changing torque seal 326A has a first color (e.g., a dark color) and color-changing torque seal 326B has a second color (e.g., a light color). In some embodiments, the dark color of color-changing torque seal 326A indicates that electrical connection 320A is not overheated, while the light color of color-changing torque seal 326B indicates that electrical connection 320B is overheated. In some embodiments, a camera (not illustrated) captures image data of the color-changing torque seals 326A and 326B, and a processor processes the image data to determine that electrical connection 320A is not overheated and/or that electrical connection 320B is overheated. In some embodiments, a technician (e.g., a human technician) can inspect electrical connections 320A and 320B to determine whether the electrical connections are overheated and/or whether the color-changing torque seals are broken.

In some embodiments, the first color is a dark color and the second color is a light color. The color of the seal may lighten as the temperature of the seal increases past the first threshold temperature. In some embodiments, the first color is a shade of blue and the second color is a corresponding lighter shade of blue. In some embodiments, the first color is a shade of red and the second color is a corresponding lighter shade of red. In some embodiments, the second color is a near-white color. In some examples, the second color may have a blue hue or a red hue dependent upon the first color.

In some embodiments, the color-changing torque seal may change to multiple different colors, each of the multiple colors associated with a corresponding threshold temperature. In some embodiments, the color-changing torque seal can change to a third color when the temperature of the color-changing torque seal increases beyond a third threshold temperature. For example, upon the temperature of the color-changing torque seal increasing to the first threshold temperature, the color of the color-changing torque seal may change from the first color to the second color. Upon the temperature of the color-changing torque seal increasing to the higher second threshold temperature, the color of the color-changing torque seal may remain the second color if the temperature of the color-changing torque seal decreases below the first threshold temperature. Upon the temperature of the color-changing torque seal increasing to the higher third threshold temperature, the color-changing torque seal may change from the second color to a third color.

Referring to FIG. 3B, in some embodiments, one or more screws are coupled to an electrical junction. The screws may retain electrical connectors, such as ring connectors, to the electrical junction. The electrical junction may electrically couple one or more of the electrical connectors (e.g., via the screws). However, the electrical junction may electrically couple only corresponding pairs of the electrical connectors. Color-changing torque seals may be disposed on each of the screws and/or connectors. In some embodiments, a paste material is applied after the torquing of the screws and cures to form the color-changing torque seals. The color-changing torque seals may change color if a threshold temperature is exceeded. Additionally, the color-changing torque seals may break if the screw and/or connector upon which the color-changing torque seal is disposed loosens. In some embodiments, a color-changing torque seal 326C has a first color and color-changing torque seal 326D has a second color. This may indicate that the temperature of the color-changing torque seal 326D has exceeded the first threshold temperature while the temperature of the color-changing torque seal 326C has not.

In some embodiments, the color-changing torque seal has a minimum service life of approximately 5 years. In some embodiments, the color-changing torque seal has a service life of approximately 10 years. In some embodiments, the color-changing torque seal is configured to be used in an environment having a temperature between approximately 10° C. and 40° C. In some embodiments, the color-changing torque seal is water-based. In some embodiments, the boiling point of the color-changing torque seal is above approximately 120° C.

FIG. 4 is a flow chart of a method 400 for determining that an electrical connection has overheated, in accordance with some embodiments. The method may be performed by processing logic that may include hardware (circuitry, dedicated logic, etc.), computer-readable instructions (run on a general purpose computer system or a dedicated machine), or a combination of both. In an illustrative example, method 400 may be performed by a processing device such as processor 230 of system 200. It should be noted that blocks depicted in FIG. 4 could be performed simultaneously or in a different order than that depicted.

At block 410, one or more cameras (e.g., camera 210 of FIG. 2) capture image data associated with a color-changing torque seal of a torqued electrical connection within the field of view of the one or more cameras. In some embodiments, multiple electrical connections are within the field of view of the one or more cameras. In some embodiments, the one or more cameras capture an image of the electrical connection periodically. For example, the one or more cameras may capture an image every second, every minute, every 10 minutes, every hour, etc. In some embodiments, the one or more cameras capture video data (e.g., multiple frames per second). In some embodiments, the color-changing torque seal is disposed on both a first electrical connector of the electrical connection and a second electrical connector of the electrical connection. The color-changing torque seal may be a thermochromic seal that changes color as the temperature of the electrical connection changes.

At block 420, a processing device (e.g., processor 230 of FIG. 2) determines that the electrical connection has reached a threshold temperature based on processing of the image data associated with the color-changing torque seal. In some embodiments, the processor processes image data received from the one or more cameras to identify a color change of the color-changing torque seal. A change in color from a first color to a second color of the color-changing torque seal may indicate that a temperature of the electrical connection has reached a threshold temperature. Further, the temperature change (and corresponding change in color) may indicate a failure condition of the associated electrical connection. The failure condition may be a broken connection, a loose connection, and/or an under-designed connection.

At block 430, the processing device determines a corrective action responsive to determining that the temperature of the electrical connection has reached the threshold temperature. In some embodiments, the corrective action may be the generation of a indication of an action to be performed (e.g., by a technician) for display on a GUI. In some embodiments, the corrective action is to inspect and/or repair the electrical connection (e.g., to fix the failure condition). In some embodiments, the corrective action is inspecting the electrical connection, replacing the first and/or second electrical connectors, and/or torquing the electrical connection. In some embodiments, the processing device generates an indication of one of the above activities for display on a GUI (e.g., for a technician to view and/or perform).

FIG. 4B is a flow chart of a method for applying a color-changing torque seal to an electrical connection, in accordance with some embodiments. At block 460, a first electrical connector is coupled to a second electrical connector such that the first and second electrical connectors contact one another. In some embodiments, the first electrical connector and/or the second electrical connectors are threaded connectors. For example, the first electrical connector may be a screw connector and the second electrical connector may be a nut connector. In some embodiments, only one of the first electrical connector or the second electrical connector is a threaded connector. For example, the first electrical connector may be a screw connector and the second electrical connector may be a ring connector configured to fit onto the screw connector. In some embodiments, the first and second electrical connectors are configured to couple using a screw and/or nut. For example, the first and second electrical connectors may be ring connectors configured to fit onto a screw. The screw may tighten into a nut, causing the first and second electrical connectors to contact one another.

At block 470, the first and/or second electrical connectors are torqued to a predetermined value. In some embodiments, a technician, using a tool, may apply a torque to the first electrical connector and/or the second electrical connector to tighten the electrical connectors together. For example, a technician may use a screwdriver and/or a wrench to tighten a screw and/or nut so that the first and second electrical connectors contact each other. The screw and/or nut may be tightened to a torque specification.

At block 480, a color-changing torque seal paste is applied to the first electrical connector and the second electrical connector. In some embodiments, the paste is squeezed (e.g., by a technician) out of a tube or out of a syringe and directed onto the first and second electrical connectors. The paste may cure to form a color-changing torque seal on the connectors. In some embodiments, the paste is wet when applied and dries within one hour. The past may cure to form the color-changing torque seal within 24 hours. In some embodiments, the color-changing torque seal is a thermochromic torque seal that changes color with temperature.

Figure 5:
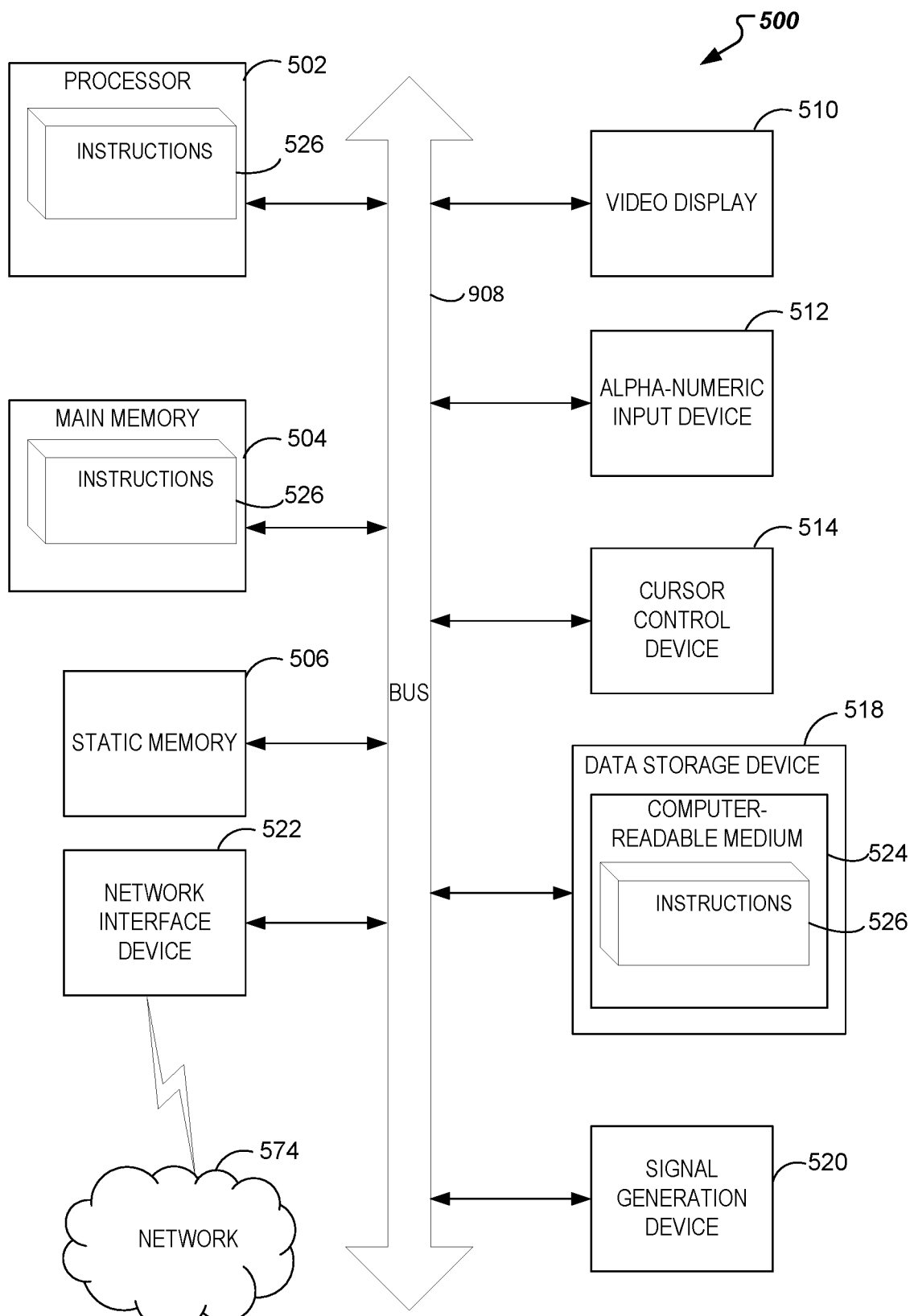
FIG. 5 is a block diagram illustrating a computer system, in accordance with some embodiments.

FIG. 5 is a block diagram illustrating a computer system 500, in accordance with some embodiments. In some embodiments, computer system 500 is connected (e.g., via a network, such as a Local Area Network (LAN), an intranet, an extranet, or the Internet) to other computer systems. In some embodiments, computer system 500 operates in the capacity of a server or a client computer in a client-server environment, or as a peer computer in a peer-to-peer or distributed network environment. In some embodiments, computer system 500 is provided by a personal computer (PC), a tablet PC, a Set-Top Box (STB), a Personal Digital Assistant (PDA), a cellular telephone, a web appliance, a server, a network router, switch or bridge, or any device capable of executing a set of instructions (sequential or otherwise) that specify actions to be taken by that device. Further, the term "computer" shall include any collection of computers that individually or jointly execute a set (or multiple sets) of instructions to perform any one or more of the methods described herein.

In a further aspect, the computer system 500 includes a processing device 502, a volatile memory 504 (e.g., Random Access Memory (RAM)), a non-volatile memory 506 (e.g., Read-Only Memory (ROM) or Electrically-Erasable Programmable ROM (EEPROM)), and a data storage device 516, which communicate with each other via a bus 508.

In some embodiments, processing device 502 is provided by one or more processors such as a general purpose processor (such as, for example, a Complex Instruction Set Computing (CISC) microprocessor, a Reduced Instruction Set Computing (RISC) microprocessor, a Very Long Instruction Word (VLIW) microprocessor, a microprocessor implementing other types of instruction sets, or a microprocessor implementing a combination of types of instruction sets) or a specialized processor (such as, for example, an Application Specific Integrated Circuit (ASIC), a Field Programmable Gate Array (FPGA), a Digital Signal Processor (DSP), or a network processor).

In some embodiments, computer system 500 further includes a network interface device 522 (e.g., coupled to network 574). In some embodiments, computer system 500 also includes a video display unit 510 (e.g., an LCD), an alphanumeric input device 512 (e.g., a keyboard), a cursor control device 514 (e.g., a mouse), and a signal generation device 520.

In some implementations, data storage device 516 includes a non-transitory computer-readable storage medium 524 on which store instructions 526 encoding any one or more of the methods or functions described herein. For example, the instructions 526 can include instructions for controlling the movement of the stage and/or digital lithography exposure units ("exposure units") of a digital lithography system, which, when executed, can implement the methods for performing exposure unit scan sequencing described herein.

In some embodiments, instructions 526 also reside, completely or partially, within volatile memory 504 and/or within processing device 502 during execution thereof by computer system 500, hence, in some embodiments, volatile memory 504 and processing device 502 also constitute machine-readable storage media.

While computer-readable storage medium 524 is shown in the illustrative examples as a single medium, the term "computer-readable storage medium" shall include a single medium or multiple media (e.g., a centralized or distributed database, and/or associated caches and servers) that store the one or more sets of executable instructions. The term "computer-readable storage medium" shall also include any tangible medium that is capable of storing or encoding a set of instructions for execution by a computer that cause the computer to perform any one or more of the methods described herein. The term "computer-readable storage medium" shall include, but not be limited to, solid-state memories, optical media, and magnetic media.

In some embodiments, the methods, components, and features described herein are implemented by discrete hardware components or are integrated in the functionality of other hardware components such as ASICS, FPGAs, DSPs or similar devices. In some embodiments, the methods, components, and features are implemented by firmware modules or functional circuitry within hardware devices. In some embodiments, the methods, components, and features are implemented in any combination of hardware devices and computer program components, or in computer programs.

Unless specifically stated otherwise, terms such as "training," "identifying," "further training," "re-training," "causing," "receiving," "providing," "obtaining," "optimizing," "determining," "updating," "initializing," "generating," "adding," or the like, refer to actions and processes performed or implemented by computer systems that manipulates and transforms data represented as physical (electronic) quantities within the computer system registers and memories into other data similarly represented as physical quantities within the computer system memories or registers or other such information storage, transmission or display devices. In some embodiments, the terms "first," "second," "third," "fourth," etc. as used herein are meant as labels to distinguish among different elements and do not have an ordinal meaning according to their numerical designation.

Examples described herein also relate to an apparatus for performing the methods described herein. In some embodiments, this apparatus is specially constructed for performing the methods described herein, or includes a general purpose computer system selectively programmed by a computer program stored in the computer system. Such a computer program is stored in a computer-readable tangible storage medium.

The methods and illustrative examples described herein are not inherently related to any particular computer or other apparatus. In some embodiments, various general purpose systems are used in accordance with the teachings described herein. In some embodiments, a more specialized apparatus is constructed to perform methods described herein and/or each of their individual functions, routines, subroutines, or operations. Examples of the structure for a variety of these systems are set forth in the description above.

The preceding description sets forth numerous specific details such as examples of specific systems, components, methods, and so forth in order to provide a good understanding of several embodiments of the present disclosure. It will be apparent to one skilled in the art, however, that at least some embodiments of the present disclosure can be practiced without these specific details. In other instances, well-known components or methods are not described in detail or are presented in simple block diagram format in order to avoid unnecessarily obscuring the present disclosure. Thus, the specific details set forth are merely exemplary. Particular implementations can vary from these exemplary details and still be contemplated to be within the scope of the present disclosure.

Reference throughout this specification to "one embodiment" or "an embodiment" means that a particular feature, structure, or characteristic described in connection with the embodiment is included in at least one embodiment. Thus, the appearances of the phrase "in one embodiment" or "in an embodiment" in various places throughout this specification are not necessarily all referring to the same embodiment. In addition, the term "or" is intended to mean an inclusive "or" rather than an exclusive "or." When the term "about" or "approximately" is used herein, this is intended to mean that the nominal value presented is precise within ±10%.

Although the operations of the methods herein are shown and described in a particular order, the order of operations of each method can be altered so that certain operations can be performed in an inverse order so that certain operations can be performed, at least in part, concurrently with other operations. In another embodiment, instructions or sub-operations of distinct operations can be in an intermittent and/or alternating manner.

It is understood that the above description is intended to be illustrative, and not restrictive. Many other embodiments will be apparent to those of skill in the art upon reading and understanding the above description. The scope of the disclosure should, therefore, be determined with reference to the appended claims, along with the full scope of equivalents to which such claims are entitled.

What is claimed is:

1. A system comprising:
   a plurality of electrical connections, each electrical connection of the plurality of electrical connections comprising:
   a first electrical connector;
   a second electrical connector that contacts the first electrical connector; and
   a color-changing torque seal disposed on the first electrical connector and the second electrical connector, wherein the color-changing torque seal is configured to change color responsive to a temperature change of one or more of the first electrical connector or the second electrical connector.

2. The system of claim 1, further comprising:
   one or more cameras, wherein the color-changing torque seal of at least one electrical connection of the plurality of electrical connections is within a field of view of the one or more cameras, and wherein the one or more cameras are configured to capture image data associated with the color-changing torque seal; and
   a processing device configured to determine that the at least one electrical connection has reached a threshold temperature based on processing of the image data associated with the color-changing torque seal.

3. The system of claim 2, wherein the processing device is configured further to initiate a corrective action responsive to a determination that the at least one electrical connection has reached the threshold temperature.

4. The system of claim 3, wherein the corrective action comprises one or more of inspecting the electrical connection, replacing one or more of the first electrical connector or the second electrical connector, or torquing the electrical connection.

5. The system of claim 1, wherein at least one of the first electrical connector or the second electrical connector is a threaded connector, and wherein the second electrical connector is configured to couple to the first electrical connector responsive to an application of torque to one or more of the first electrical connector or the second electrical connector.

6. The system of claim 5, wherein the color-changing torque seal is configured to visually indicate whether the second electrical connector has rotated relative to the first electrical connector.

7. The system of claim 1, wherein the temperature change is indicative of a failure condition of an associated electrical connection of the plurality of electrical connections.

8. The system of claim 7, wherein the failure condition comprises one or more of a broken connection, a loose connection, or an under-designed connection.

9. The system of claim 1, wherein the color-changing torque seal is further configured to change from a first color to a second color responsive to a temperature of the color-changing torque seal exceeding a first threshold temperature and remaining below a second threshold temperature.

10. The system of claim 9, wherein the color-changing torque seal is further configured to change from the second color to the first color responsive to the temperature of the color-changing torque seal cooling below the first threshold temperature, and wherein the color-changing torque seal permanently retains the second color responsive to the temperature of the color-changing torque seal exceeding the second threshold temperature.

11. The system of claim 10, wherein the first threshold temperature is between approximately 45 and 55 degrees Celsius (° C.) and wherein the second threshold temperature is between approximately 65 and 75° C.

12. An electrical connection comprising:
a first electrical connector;
a second electrical connector that contacts the first electrical connector; and
a color-changing torque seal disposed on the first electrical connector and the second electrical connector, wherein the color-changing torque seal is configured to change color responsive to a temperature change in one or more of the first electrical connector or the second electrical connector.

13. The electrical connection of claim 12, wherein at least one of the first electrical connector or the second electrical connector is a threaded connector, and wherein the second electrical connector is configured to couple to the first electrical connector responsive to an application of torque to one or more of the first electrical connector or the second electrical connector.

14. The electrical connection of claim 13, wherein the color-changing torque seal is configured to visually indicate whether the second electrical connector has rotated relative to the first electrical connector.

15. The electrical connection of claim 12, wherein the temperature change is indicative of a failure condition of the electrical connection.

16. The electrical connection of claim 15, wherein the failure condition comprises one or more of a broken connection, a loose connection, or an under-designed connection.

17. The electrical connection of claim 12, wherein the color-changing torque seal is further configured to change from a first color to a second color responsive to a temperature of the color-changing torque seal exceeding a first threshold temperature and remaining below a second threshold temperature.

18. The electrical connection of claim 17, wherein the color-changing torque seal is further configured to change from the second color to the first color responsive to the temperature of the color-changing torque seal cooling below the first threshold temperature, and wherein the color-changing torque seal permanently retains the second color responsive to the temperature of the color-changing torque seal exceeding the second threshold temperature.

19. A method comprising:
capturing image data, by one or more cameras, associated with a color-changing torque seal of an electrical connection of a plurality of electrical connections, wherein the electrical connection comprises:
a first electrical connector;
a second electrical connector that contacts the first electrical connector; and
the color-changing torque seal, wherein the color-changing torque seal is configured to change color responsive to a temperature change of one or more of the first electrical connector or the second electrical connector; and
determining, by a processing device, that a temperature of the electrical connection has reached a threshold temperature based on processing of the image data associated with the color-changing torque seal; and
determining, by the processing device, a corrective action responsive to a determination that the temperature of the electrical connection has reached the threshold temperature.

20. The method of claim 19, wherein the temperature change is indicative of a failure condition of the electrical connection.

* * * * *